United States Patent [19]

Brown et al.

[11] Patent Number: 4,824,802
[45] Date of Patent: Apr. 25, 1989

[54] METHOD OF FILLING INTERLEVEL DIELECTRIC VIA OR CONTACT HOLES IN MULTILEVEL VLSI METALLIZATION STRUCTURES

[75] Inventors: Dale M. Brown, Schenectady; Bernard Gorowitz, Clifton Park; Richard J. Saia, Scotia, all of N.Y.

[73] Assignee: General Electric Company, Schenectady, N.Y.

[21] Appl. No.: 104,002

[22] Filed: Oct. 2, 1987

Related U.S. Application Data

[63] Continuation of Ser. No. 835,025, Feb. 28, 1986, abandoned.

[51] Int. Cl.$^4$ .................. H01L 21/283; H01L 21/312
[52] U.S. Cl. .................... 437/192; 437/201; 437/187; 437/245; 437/228
[58] Field of Search ............... 437/187, 188, 245, 246, 437/228, 201, 203, 229, 192, 190, 193

[56] References Cited

U.S. PATENT DOCUMENTS 4,520,041   5/1985   Aoyama et al. ..................... 437/228

OTHER PUBLICATIONS

Parry et al, "Anisotropic Plasma et Cling . . . ", *Solid State Technology*, Apr. 1979, pp. 125–132.
Moziya et al, "A Planar Metallization Process", *IEDM Technical Digest*, 1983, pp. 550–553.
Ghandhi, *YLSI Fabrication Principles*, John Wiley & Sons, 1983, pp. 498–517.

*Primary Examiner*—Brian E. Hearn
*Assistant Examiner*—T. N. Quach
*Attorney, Agent, or Firm*—Robert Ochis; James C. Davis, Jr.; Marvin Snyder

[57] ABSTRACT

A method compatible with very large scale integrated circuit fabrication processes is employed to provide an electrical connection between conductive layers separated by an insulative layer in integrated circuit devices. An intermediary metal such as molybdenum or tungsten is deposited by one or more methods so as to fill an opening in the insulative layer. A planarization resist may be applied on the substrate and the resulting configuration is planarizingly etched down to the insulative layer so as to provide a metal plug conductive layers. Deposition is by sputtering, evaporation, or by either selective or non-selective chemical vapor deposition. The process and structure provided herein significantly alleviates step coverage problems associated with aluminum and like materials which do not readily penetrate small VLSI circuit openings.

8 Claims, 3 Drawing Sheets

METHOD OF FILLING INTERLEVEL DIELECTRIC VIA OR CONTACT HOLES IN MULTILEVEL VLSI METALLIZATION STRUCTURES

This application is a continuation of application Ser. No. 835,025, filed 2/28/86, now abandoned.

BACKGROUND OF THE INVENTION

The present invention is generally directed to a method for providing plugs in via or contact holes in integrated circuit chips and devices. More particularly, the present invention is directed to a method of providing electrical contact between distinct conductive layers in very large scale integrated circuits (VLSI).

One of the most serious problems associated with the manufacture of very large integrated circuits is in providing adequate step coverage for small openings. As circuit dimensions shrink, contact hole sizes must also be reduced. These holes or vias are provided to make contact between different layers of metallization or between other conductive layers in VLSI devices. It is not sufficient to simply cover over a hole, but rather it is necessary that electrically conductive material be deposited so as to fill the hole and make contact with an underlying conductive layer and to extend through the via opening sufficiently far so as to enable contact with an upper conductive layer. These conductive metallization layers are appropriately patterned to achieve electrical interconnections between various components and between various points on a circuit chip. As the opening size is shrunk, however, step coverage at the edge of the openings is more and more difficult particularly for metals such as aluminum which is an otherwise generally desirable constituent of various metallization layers.

One method that is employed to solve step coverage problems is by tapering the contact hole so that less "shadowing" occurs during metal deposition. However, tapering of the vias is not an effective method for reducing contact opening diameter.

Another problem that must be addressed by any interlevel connection method or structure is the fact that in an integrated circuit chip there exists a need for connection through openings of various depths. Since many structures are formed by etching which generally takes place at the same rate across the hole surface of the substrate, structures exhibiting different depth dimensions are affected differently. In particular, the use of tapered holes renders it difficult to control the dimensions for openings of various depths. Accordingly, it is seen that tapering of the via walls is not an entirely adequate solution for the step coverage problem for small interlevel openings.

One of the other methods that has been proposed for the solution of this problem is the lift-off of aluminum. However, the aluminum lift-off process does not work well for very small openings and large complicated circuits.

SUMMARY OF THE INVENTION

In accordance with a preferred embodiment of the present invention, a method of forming an electrical connection to a conductive layer underlying an insulative layer on an integrated substrate is provided. First an opening is formed in the insulative layer so as to expose an underlying portion of the conductive layer. Then an intermediary metal is deposited on the substrate so that it substantially fills the opening and extends over at least a portion of the insulative layer. Then a planarization resist is applied and flowed over the substrate and is then planarizingly etched by plasma or reactive ion etching along with the intermediary metal down to the insulative layer whereby the opening is provided with a metal plug in electrical contact with the underlying conductive layer. In an alternate embodiment of the present invention, the intermediary metal is deposited in sufficient thickness by non-selective chemical vapor deposition so that the planarizing etching may or may not require prior application of a planarizing resist.

In accordance with preferred embodiments of the present invention, the intermediary metal comprises molybdenum or tungsten or mixtures thereof. The intermediary metal is deposited by sputtering, evaporation, or by chemical vapor deposition. Moreover, if chemical vapor deposition is employed, then this process may be either selective or non-selective.

In accordance with another embodiment of the present invention, a contact structure for interlevel connection in integrated circuits is produced comprising a first conductive layer, an insulative layer disposed over the first conductive layer, with a metal plug disposed within an opening in the insulative layer. A second conductive layer lies over the insulative layer and in contact with the intermediary metal plug so that contact between the first conductive layer and the second, overlying conductive layer is accomplished. This structure is particularly applicable to contact via openings less than approximately 2 microns, and in which the walls of the via opening are substantially vertical.

Accordingly, it is an object of the present invention to provide a method for forming electrical connections between conductive layers in multilevel integrated circuits.

It is also an object of the present invention to provide a process for interlevel interconnection which is consistent with conventional semiconductor chip fabrication methods.

It is yet another object of the present invention to provide contact plugs between metallization layers, the plugs being smooth and not possessing nailhead type protrusions.

It is still another object of the present invention to provide a structure for interlevel interconnection in VLSI circuit devices.

It is a still further object of the present invention to provide a method for filling via or contact openings in integrated circuit devices.

It is yet another object of the present invention to solve the problem of step coverage in small integrated circuit contact openings.

Lastly, but not limited hereto, it is an object of the present invention to provide a solution to the problem of contact opening overfill by plug material.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
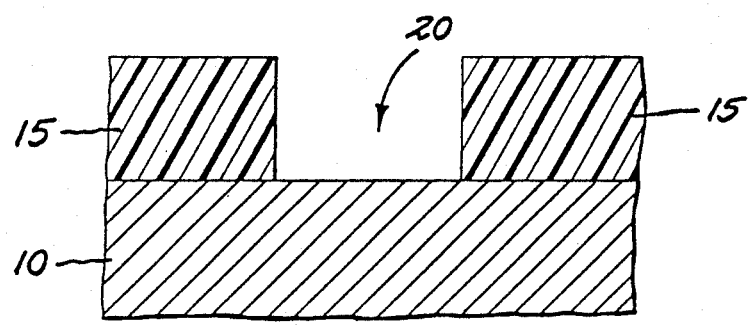
FIG. 1 is a cross-sectional side elevation view illustrating the result of forming an opening in an insulative layer so as to expose an underlying portion of conductive material.

FIG. 1 illustrates the result of a first process step in accordance with the present invention. More particularly, opening 20 is shown in dielectric layer 15 which overlies a first or lower conductive layer 10. Layer 15 typically comprises a dielectric material such as silicon oxide, silicon nitride, or combinations thereof. Layer 10 typically comprises a metal or other conductive material. Typically, layer 10 comprises material such as aluminum. It should be understood that dielectric layer 15 typically possesses appropriate patterns in accordance with the electrical functions of the semiconductor device. Likewise, layer 10 also typically exists in a patterned condition forming electrical leads and other structures. The problem of contact to layer 10 is exacerbated by the small dimensions of opening 20 which is typically less than approximately 2 microns in diameter or width. It is this small opening which causes step size problems which are alleviated by the process and structure of the present invention. Opening 20 in dielectric layer 15 is produced in accordance with conventional processing, typically employing a photoresist mask, exposure, plasma or reactive ion etching and resist removal. However, the method of the present invention is not limited thereto and encompasses any method employed for producing micron and submicron size holes in dielectric integrated circuit materials.

Figure 2:
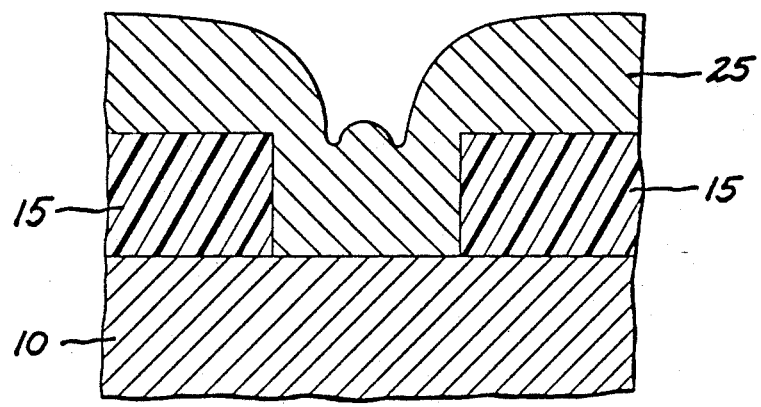
FIG. 2 is a cross-sectional, side elevation view illustrating deposition of intermediary metal in accordance with one embodiment of the present invention.
Figure 6:
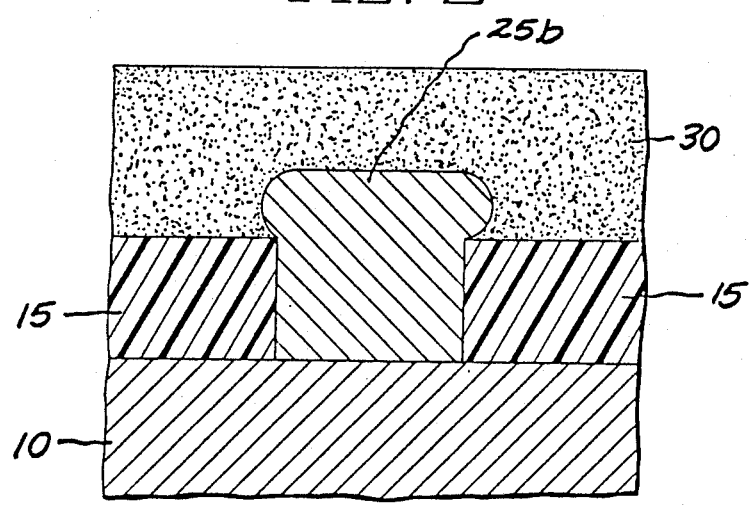
FIG. 6 is a cross-sectional, side elevation view illustrating a process step stage occurring as a result of a process in accordance with one embodiment of the present invention in which intermediary metal plug material is deposited by selective chemical vapor deposition resulting in the forming of a nailhead-like structure at the via opening.
Figure 7:
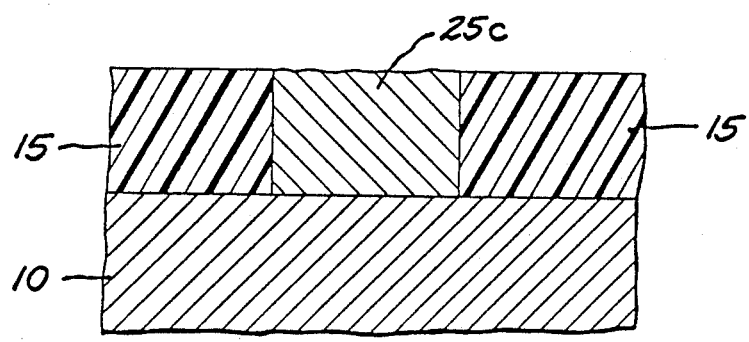
FIG. 7 is a cross-sectional, side elevation view illustrating the effect of etching the structure shown in FIG. 6.

FIG. 2 illustrates the next step in a process in accordance with the present invention, namely, the deposition of a quantity of intermediary metal 25. Intermediary metal 25 substantially fills opening 20 and extends over at least a portion of insulative layer 15. Intermediary metal 25 preferably comprises either molybdenum or tungsten. However, it is noted that any metal capable of being deposited in the bottom of narrow opening 20 may be employed. It is also noted that while FIG. 2 shows intermediary metal 25 almost completely filling opening 20, it is also contemplated that partial filling is also capable of providing means for interconnection because planarization is employed to produce a partial plug whose upper surface is available for electrical contact. It is particularly noted that intermediary metal 25 does not have to exhibit particularly low resistivity since the distance over which it is required to conduct electrical currents is small. Intermediary metal 25 may be deposited by sputtering, evaporation, or by chemical vapor deposition. More particularly, chemical vapor deposition of intermediary metal 25 may be performed either selectively or non-selectively. It is noted, however, that FIG. 2 is not illustrative of selective chemical vapor deposition process. For consideration of such processes, attention is directed to the discussions below with respect to FIGS. 6 and 7.

Figure 3:
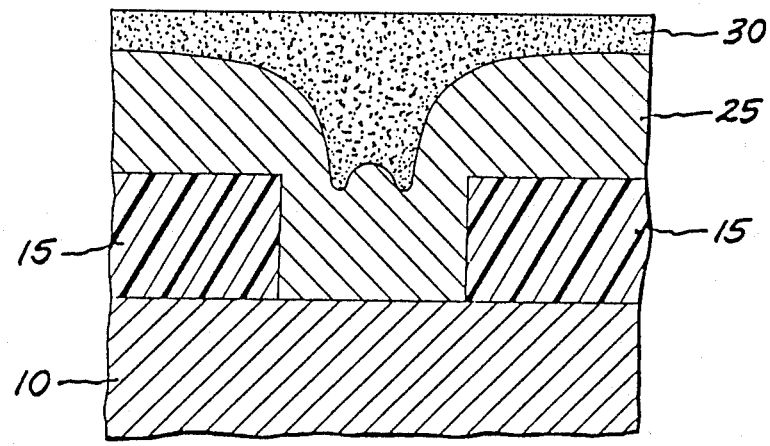
FIG. 3 is a cross-sectional, side elevation view illustrating the application of planarization resist material over the deposited intermediary metal layer.
Figure 4:
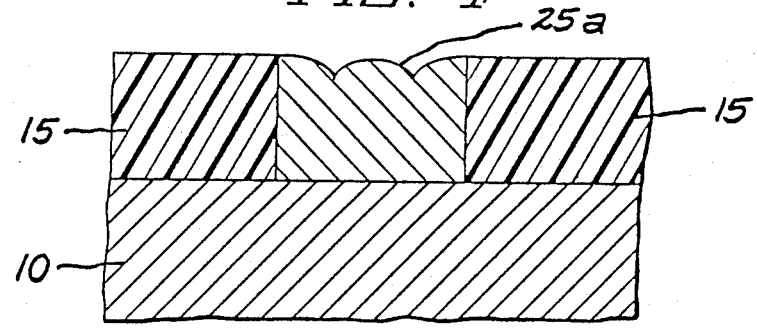
FIG. 4 is a cross-sectional, side elevation view illustrating the results of etching performed on the structure shown in FIG. 3.
Figure 5:
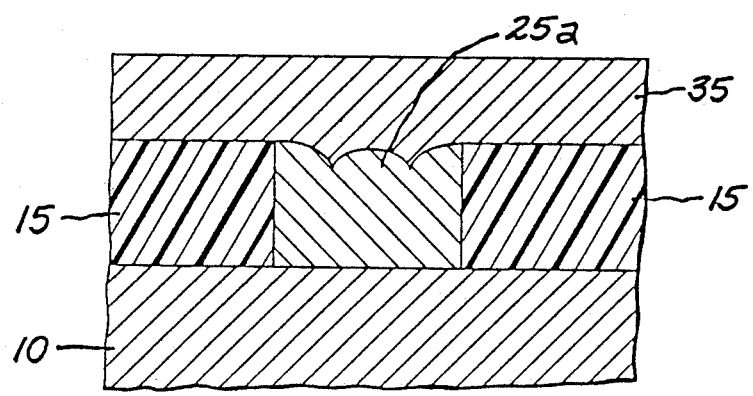
FIG. 5 is a cross-sectional, side elevation view particularly illustrating the disposition of an upper conductive layer in electrical contact with intermediary metal plug material.

In accordance with one embodiment of the present invention, planarization resist material 30 is applied and flowed over layer 25, as illustrated in FIG. 3. Suitable resist materials for this process step include azoquinonenovalac-type photoresists, polymethylmethacrylates and polyimides or other thermoplastic materials. Next, resist 30 and intermediary metal layer 25 are etched down to the level of insulative layer 15 thereby resulting in the structure shown in FIG. 4 in which plug 25a of intermediary material is shown as being disposed in former opening 20. Resist material 30 and intermediary metal 25 are preferably etched at substantially the same rate. Minor irregularities occurring in the surface of plug 25a are inconsequential because they possess little depth and are easily covered by a second or upper layer of conductive material 35 as illustrated in FIG. 5. Suitable materials for conductive layer 35 include aluminum and aluminum alloys. Suitable materials for performing plasma or reactive ion etching that occurs between the stages illustrated in FIGS. 3 and 4 include gas mixtures such as $CCl_2F_2$ and $O_2$; $NF_3$ and Ar; and $SF_6$, $Cl_2$ and $O_2$.

In accordance with another embodiment of the present invention, intermediary metal 25 is deposited by selective chemical vapor deposition. Materials particularly useful for such deposition include molybdenum and tungsten, but the method herein is not limited thereto. In order to ensure complete filling of via openings, particularly where various depth openings occur, deposition is performed for a sufficiently long time. However, because of the presence of various depth openings, nailhead type formations, as illustrated by metal structure 25b in FIG. 6 often result because of the need to sufficiently fill openings with a greater depth. However, application of a planarizing resist 30 and subsequent etch back produces a structure such as that illustrated in FIG. 7 in which metal plug 25c is seen in contact with underlying conductive layer 10. As in FIG. 5, a second or upper conductive layer 35 is typically applied to the structure illustrated in FIG. 7. The resist and etching material employed are the same as those described above.

In accordance with yet another embodiment of the present invention, intermediary metal 25 may be deposited to such a thickness that resist material 30 need not be deposited prior to etch back to insulative layer 15. In the case of nonselective chemical vapor deposition, such a thickness would be approximately twice the diameter of the via opening shown in FIG. 2.

From the above, it should be appreciated that the method and structure of the present invention provides a desirable means for connecting distinct conductive layers in integrated circuit chips, regardless of via opening size. It is seen that the methods and processes of the present invention are entirely compatible with conventional VLSI circuit fabrication processes. The planarization process for the deposited intermediary metal, particularly molybdenum, is easy to perform and requires no additional mask steps. In particular, it is seen that selective chemical vapor deposition of molybdenum or tungsten is desirable since the contact vias fill faster and require less total metal deposition than sputtering or evaporation. It is also seen that the methods and structure of the present invention entirely eliminate step coverage problems typically associated with such metals as aluminum. Accordingly, it is seen that the structure and methods of the present invention advance the state of the art of very large scale integrated circuit design and fabrication.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method of forming an electrical connection to a conductive layer underlying an insulative layer on an integrated circuit substrate, said method comprising the steps of:

forming an opening in said insulative layer so as to expose an underlying portion of said conductive layer through said opening;

selectively depositing an intermediary metal in said opening so that said intermediary metal substantially fills said opening and extends over said insulative layer only in the vicinity of said opening;

applying and flowing a planarization resist over said substrate; and planarizingly etching said resist and said intermediary metal down to said insulative layer by reactive ion etching or plasma etching, whereby said opening is provided with a metal plug in electrical contact with said underlying conductive layer.

2. The method of claim 1 further including the step of disposing a conductive layer over said opening and in contact with said intermediary metal.

3. The method of claim 1 in which said intermediary metal comprises material selected from the group consisting of molybdenum and tungsten.

4. The method of claim 1 in which said intermediary metal is deposited by chemical vapor deposition.

5. The method of claim 1 in which said resist comprises material selected from the group consisting of azoquinone-novalac-type photoresists, polymethylmethacrylates and polyimides.

6. The method of claim 1 in which said resist and said intermediary metal are etched at substantially the same rate.

7. The method of claim 1 in which said etching is plasma etching.

8. The method of claim 1 in which said etching is reactive ion etching.

* * * * *